(12) United States Patent
Lee et al.

(10) Patent No.: US 12,431,355 B2
(45) Date of Patent: Sep. 30, 2025

(54) METHOD AND SYSTEM FOR FORMING PATTERNED FEATURES ON A SURFACE OF A SUBSTRATE USING A PLASMA-ENHANCED CYCLICAL DEPOSITION PROCESS

(71) Applicant: ASM IP Holding B.V., Almere (NL)

(72) Inventors: Seunghyun Lee, Tokyo (JP); Yeahyun Gu, Hwaseong-si (KR); Hyunchul Kim, Hwaseong-si (KR); Naoki Inoue, Tokyo (JP)

(73) Assignee: ASM IP Holding B. V., Almere (NL)

( * ) Notice: Subject to any disclaimer, the term of this patent is extended or adjusted under 35 U.S.C. 154(b) by 540 days.

(21) Appl. No.: 17/460,673

(22) Filed: Aug. 30, 2021

(65) Prior Publication Data

US 2022/0068647 A1 Mar. 3, 2022

Related U.S. Application Data

(60) Provisional application No. 63/073,586, filed on Sep. 2, 2020.

(51) Int. Cl.
*H01L 21/033* (2006.01)
*C23C 16/455* (2006.01)
*H01J 37/32* (2006.01)

(52) U.S. Cl.
CPC ...... *H01L 21/0338* (2013.01); *C23C 16/4554* (2013.01); *H01J 37/32449* (2013.01); *H01L 21/0332* (2013.01); *H01L 21/0335* (2013.01); *H01L 21/0337* (2013.01); *H01J 2237/332* (2013.01)

(58) Field of Classification Search
CPC ............. H01L 21/0338; H01L 21/0332; C23C 16/4554; H01J 37/32449
See application file for complete search history.

(56) References Cited

U.S. PATENT DOCUMENTS

| | | | |
|---|---|---|---|
| 2003/0062627 A1* | 4/2003 | Naik | H01L 21/76811 257/773 |
| 2012/0088369 A1* | 4/2012 | Weidman | G03F 7/094 430/296 |
| 2017/0316940 A1* | 11/2017 | Ishikawa | H01L 21/0234 |
| 2020/0135462 A1* | 4/2020 | Chang | H01L 21/02211 |

FOREIGN PATENT DOCUMENTS

TW 312029 B 8/1997

* cited by examiner

*Primary Examiner* — Lex H Malsawma
*Assistant Examiner* — Bruce R. Smith
(74) *Attorney, Agent, or Firm* — Snell & Wilmer L.L.P.

(57) ABSTRACT

Methods of forming patterned features on a surface of a substrate are disclosed. Exemplary methods include using a plasma-enhanced cyclical deposition process to form a transformable layer including a first material and exposing the transformable layer to energy to form a second material. The first or second material can be selectively etched relative to the other of the first and second material.

20 Claims, 7 Drawing Sheets

METHOD AND SYSTEM FOR FORMING PATTERNED FEATURES ON A SURFACE OF A SUBSTRATE USING A PLASMA-ENHANCED CYCLICAL DEPOSITION PROCESS

CROSS-REFERENCE TO RELATED APPLICATIONS

This application claims the benefit of and priority to U.S. Application No. 63/073,586, filed on Sep. 2, 2020 in the United States Patent and Trademark Office, the disclosure of which is incorporated herein in its entirety by reference.

FIELD OF INVENTION

The present disclosure generally relates to methods and systems for forming patterned features on a surface of a substrate. More particularly, examples of the disclosure relate to methods and systems that can be used to form a transformable layer that can be used in the manufacture of devices.

BACKGROUND OF THE DISCLOSURE

During the manufacture of electronic devices, fine patterns of features can be formed on a surface of a substrate by patterning the surface of the substrate and removing material from the substrate surface using, for example, wet etch and/or dry etch processes. Photoresist is often used for such patterning of a surface of a substrate.

A photoresist pattern can be formed by coating a layer of photoresist onto a surface of the substrate, masking the surface of the photoresist, exposing the unmasked portions of the photoresist to radiation, such as ultraviolet light or an electron beam, and removing a portion (e.g., the unmasked or masked portion) of the photoresist, while leaving a portion (e.g., the other of the unmasked or masked portion) of the photoresist on the substrate surface. Once the photoresist is patterned, the patterned photoresist can be used as a template for etching material on the substrate surface in regions in which the photoresist was removed. After etching, remaining photoresist is removed by stripping the photoresist and/or ashing.

As noted above, traditional photoresist processes include steps for coating and removing the photoresist. In other words, the photoresist is removed during the manufacture of devices, such that the photoresist generally does not form part of the device. Although such techniques work well in some applications, the techniques require a relatively large number of steps, such as coating, developing, and stripping the photoresist. In addition, typical photoresist techniques use relatively expensive equipment, such as coaters, developers and photoresist strippers. Furthermore, because the photoresist is used and removed and does not form part of a device, additional materials are required to form the device. And, traditional photoresist techniques may provide relatively high opportunities for misalignment.

Accordingly, improved methods of forming patterned features on a surface of a substrate are desired. Further, structures, such as structures suitable for forming devices, which include the patterned features are also desired.

Any discussion of problems and solutions set forth in this section has been included in this disclosure solely for the purpose of providing a context for the present disclosure, and should not be taken as an admission that any or all of the discussion was known at the time the invention was made.

SUMMARY OF THE DISCLOSURE

Various embodiments of the present disclosure relate to methods of forming patterned features on a surface of a substrate, to systems for forming the patterned features, and to structures including the patterned features. The patterned features can be used in the formation of devices, such as semiconductor devices.

While the ways in which various embodiments of the present disclosure address drawbacks of prior methods, systems, and structures are discussed in more detail below, in general, various embodiments of the disclosure provide improved methods of forming patterned features on a surface of a substrate using fewer process steps and/or less equipment.

In accordance with exemplary embodiments of the disclosure, a method of forming patterned features on a surface of a substrate is provided. One or more exemplary methods include the steps of using a plasma-enhanced cyclical deposition process, forming a transformable layer comprising a first material on the surface of the substrate and exposing the transformable layer to energy to form a second material in a first region of the transformable layer exposed to the energy and a second region of the transformable layer not exposed to the energy comprising the first material, wherein an etch rate of the first material is different than an etch rate of the second material. In accordance with various aspects of these embodiments, the first material includes one or more of silicon, titanium, tin, hafnium, zirconium, indium, antimony, tellurium, iodine, and cesium. In accordance with further examples, the method includes a step of selectively etching the first material relative to the second material or selectively etching the second material relative to the first material.

In accordance with further embodiments of the disclosure, a structure is provided. The structure can be formed according to a method as set forth herein. The structure can include a substrate and one patterned feature formed overlying the substrate.

In accordance with further examples of the disclosure, a device comprises or is formed using a structure as described herein.

In accordance with yet additional examples of the disclosure, a system configured to perform a method and/or form a structure as described herein is provided.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
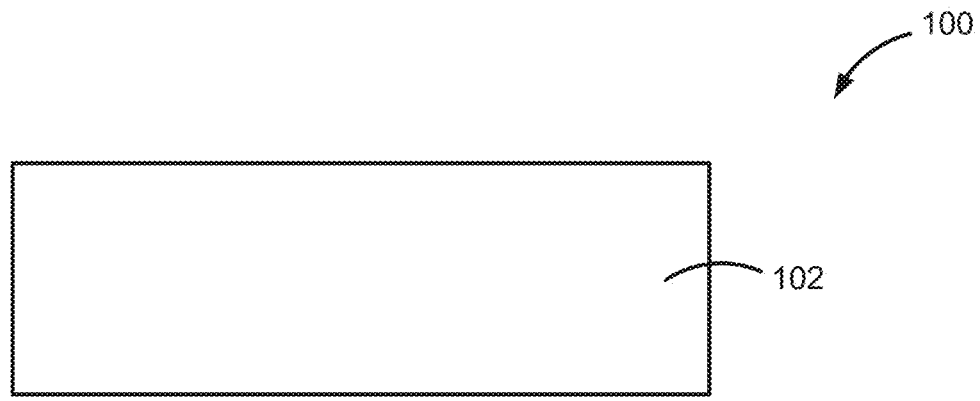
FIGS. 1-6 illustrate structures in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming patterned features on a surface of a substrate, to structures including the patterned features—e.g., formed using methods described herein, and to systems for performing the methods and/or forming the structures. As described in more detail below, various methods can be used to form structures suitable for forming electronic devices. Exemplary methods can be used to form a transformable layer, expose a portion of the transformable layer to energy to transform the portion of the transformable layer, and remove a transformed portion or a non-transformed portion of the transformable layer. As discussed in more detail below, the portion of the transformable layer that is not removed can form part of a device structure and/or part of a device.

As further set forth in more detail below, exemplary methods and systems can be used to form devices with desired properties in a relatively efficient manner. Exemplary methods can be used to form patterned features in a layer using fewer processing steps and/or using less equipment.

In this disclosure, gas may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. The terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include a dielectric layer, such as a silicon oxide.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments.

The term cyclic deposition process or cyclical deposition process can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

As used herein, the term atomic layer deposition (ALD) may refer to a vapor deposition process in which deposition cycles, preferably a plurality of consecutive deposition cycles, are conducted in a process chamber. Typically, during each cycle, a precursor is introduced and may be chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PEALD refers to an ALD process, in which a plasma is applied during one or more of the ALD steps.

As used herein, silicon oxide refers to a material that includes silicon and oxygen. Silicon oxide can be represented by the formula $SiO_x$, where x can be between 0 and 2 (e.g., $SiO_2$). In some cases, the silicon oxide may not include stoichiometric silicon oxide. In some cases, the silicon oxide can include other elements, such as carbon, nitrogen, hydrogen, or the like.

As used herein, silicon oxygen carbide refers to material that can be represented by the chemical formula $Si_wO_xC_y$, where w can range from about 0 to about 2, x can range from about 0 to about 2, and y can range from about 0 to about 5.

As used herein, silicon oxygen carbon nitride refers to material that can be represented by the chemical formula $Si_wO_xC_yN_z$, where w can range from about 0 to about 2, x can range from about 0 to about 2, y can range from about 0 to about 2, and z can range from about 0 to about 2.

As used herein, metal carbide refers to material that can be represented by the chemical formula $M_wO_xC_y$, where w can range from about 0 to about 2, x can range from about 0 to about 2 and y can range from about 0 to about 5. M can be a metal or metalloid, such as one or more of titanium, tin, hafnium, zirconium, indium, antimony, tellurium, iodine, and cesium.

As used herein, metal carbon nitride refers to material that can be represented by the chemical formula $M_wO_xC_yN_z$, where w can range from about 0 to about 2, x can range from about 0 to about 2, y can range from about 0 to about 2, and z can range from about 0 to about 2. M can be a metal or metalloid, such as one or more of titanium, tin, hafnium, zirconium, indium, antimony, tellurium, iodine, and cesium.

The term metal oxide can refer to metal that includes a metal or metalloid and oxygen. The metal or metalloid can be, for example, one or more of titanium, tin, hafnium, zirconium, indium, antimony, tellurium, iodine, and cesium.

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms include, including, constituted by and having can refer independently to typically or broadly comprising, consisting essentially of, or consisting of in some embodiments. In this disclosure, any defined meanings do not necessarily exclude ordinary and customary meanings in some embodiments.

As noted above, typical techniques for forming patterned features on a surface of a substrate include the use of typical photoresist. Such techniques include coating, developing, and stripping the photoresist—in addition to etching an underlying layer. In contrast, techniques described below can include fewer processing steps to form patterned features. Further, exemplary techniques described below can allow for less opportunities and/or less misalignment of the patterned features.

Exemplary methods of forming patterned features on a surface of a substrate include using a plasma-enhanced cyclical deposition process to form a transformable layer on a surface of a substrate. The transformable layer includes a first material comprising one or more of silicon, titanium, tin, hafnium, zirconium, indium, antimony, tellurium, iodine, and cesium. By way of examples, the transformable layer can be or include one or more of silicon oxygen carbon nitride, silicon oxygen carbide, metal carbide, and metal carbon nitride.

The method further includes exposing the transformable layer to energy, such as radiation (e.g., ultraviolet or extreme ultraviolet radiation), to form a second material in a first region of the transformable layer exposed to the energy and a second region of the transformable layer not exposed to the energy comprising the first material. An etch rate of the first material (e.g., not transformed) is different than an etch rate of the (transformed) second material. Thus, the first or second material can be selectively etched from the surface of the substrate.

Figure 5:
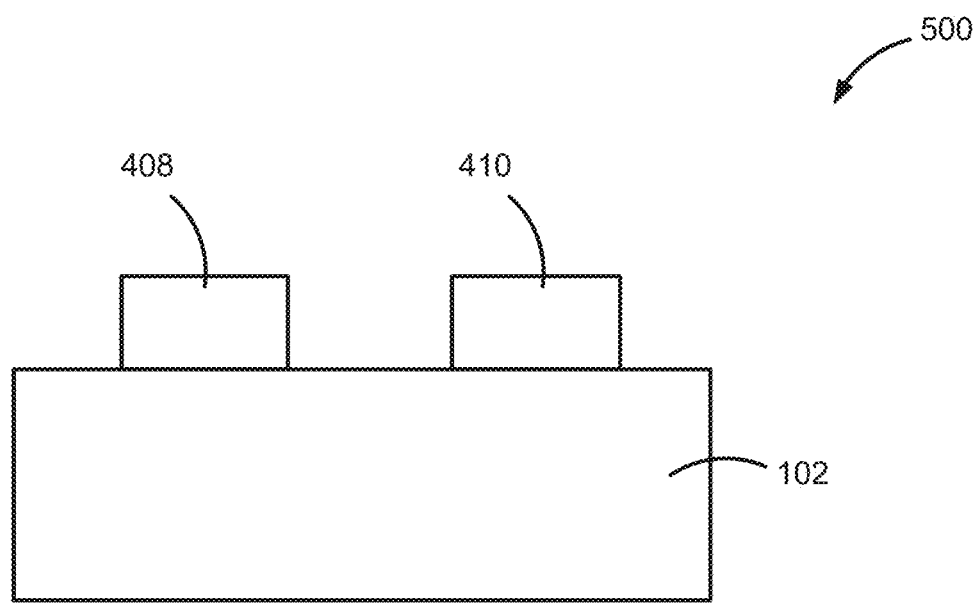
Figure 6:
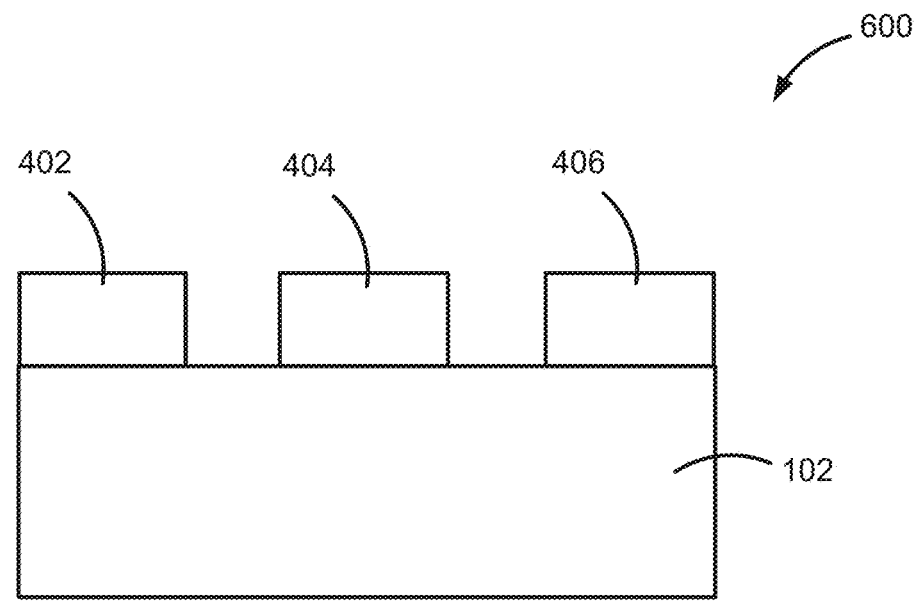

FIGS. 1-6 illustrate structures formed in accordance with exemplary methods. FIG. 5 illustrates an example wherein a transformable layer is a negative transformable layer. FIG. 6 illustrates an example wherein a transformable layer is a positive transformable layer.

With reference to FIG. 1, a substrate 102 prior to forming a transformable layer thereon is illustrated. Substrate 102 can include a substrate as described above, such as a substrate including a dielectric layer, such as silicon oxide.

Figure 2:
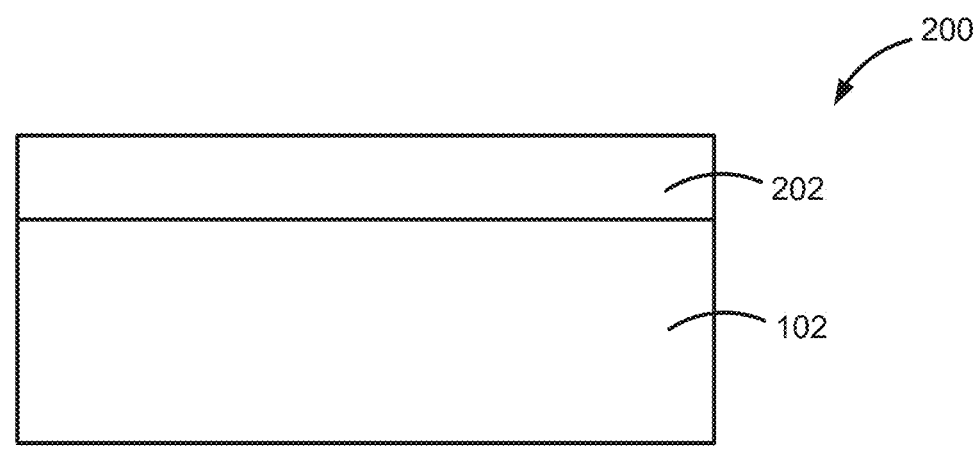

FIG. 2 illustrates a structure 200 including transformable layer 202 overlying substrate 102. In accordance with examples of the disclosure, transformable layer 202 includes a first material including one or more of silicon, titanium, tin, hafnium, zirconium, indium, antimony, tellurium, iodine, and cesium. For example, transformable layer 202/first material can be or include silicon oxygen carbon nitride, silicon oxygen carbide, metal carbide, and/or metal carbon nitride. The first material can be formed using a plasma-enhanced cyclical deposition process.

The plasma-enhanced cyclical deposition process can include providing a precursor to the reaction chamber for a precursor pulse period, providing a reactant to the reaction chamber for a reactant pulse period, and exposing the reactant to a plasma for a plasma pulse period. The method can additionally include a step of providing an inert gas to the reaction chamber for an inert gas pulse period. Alternatively, the plasma-enhanced cyclical deposition process can include providing a precursor to the reaction chamber for a precursor pulse period, providing an inert gas to the reaction chamber for an inert gas pulse period, and exposing the inert gas to a plasma for a plasma pulse period. Exemplary methods can also include a purge step after one or more of the steps of providing a precursor to the reaction chamber, exposing the reactant to a plasma, and/or exposing the inert gas to a plasma. In some cases, the plasma-enhanced cyclical deposition process can be or include a plasma-assisted ALD (PEALD) process.

A precursor provided during the step of providing a precursor to the reaction chamber for a precursor pulse period can include, for example, one or more of a silicon-containing precursor, such as an aminosilane and a metal or metalloid precursor, such as a metal organic compound. The precursor can include one or more of silicon, titanium, tin, hafnium, zirconium, indium, antimony, tellurium, iodine, and cesium. By way of particular examples, the precursor can include silicon and/or titanium. Exemplary silicon and titanium precursors include one or more of diisopropylaminosilane, bis(diethylamino) silane, tetrakis (dimethylamino) titanium, and titanium isopropoxide.

A reactant provided during the step of providing a reactant to the reaction chamber for a reactant pulse period can include a nitrogen-containing compound. For example, the nitrogen-containing compound can include nitrogen, a mixture of nitrogen and inert gas (e.g., argon or He).

The inert gas can be or include, for example, argon.

Figure 7:
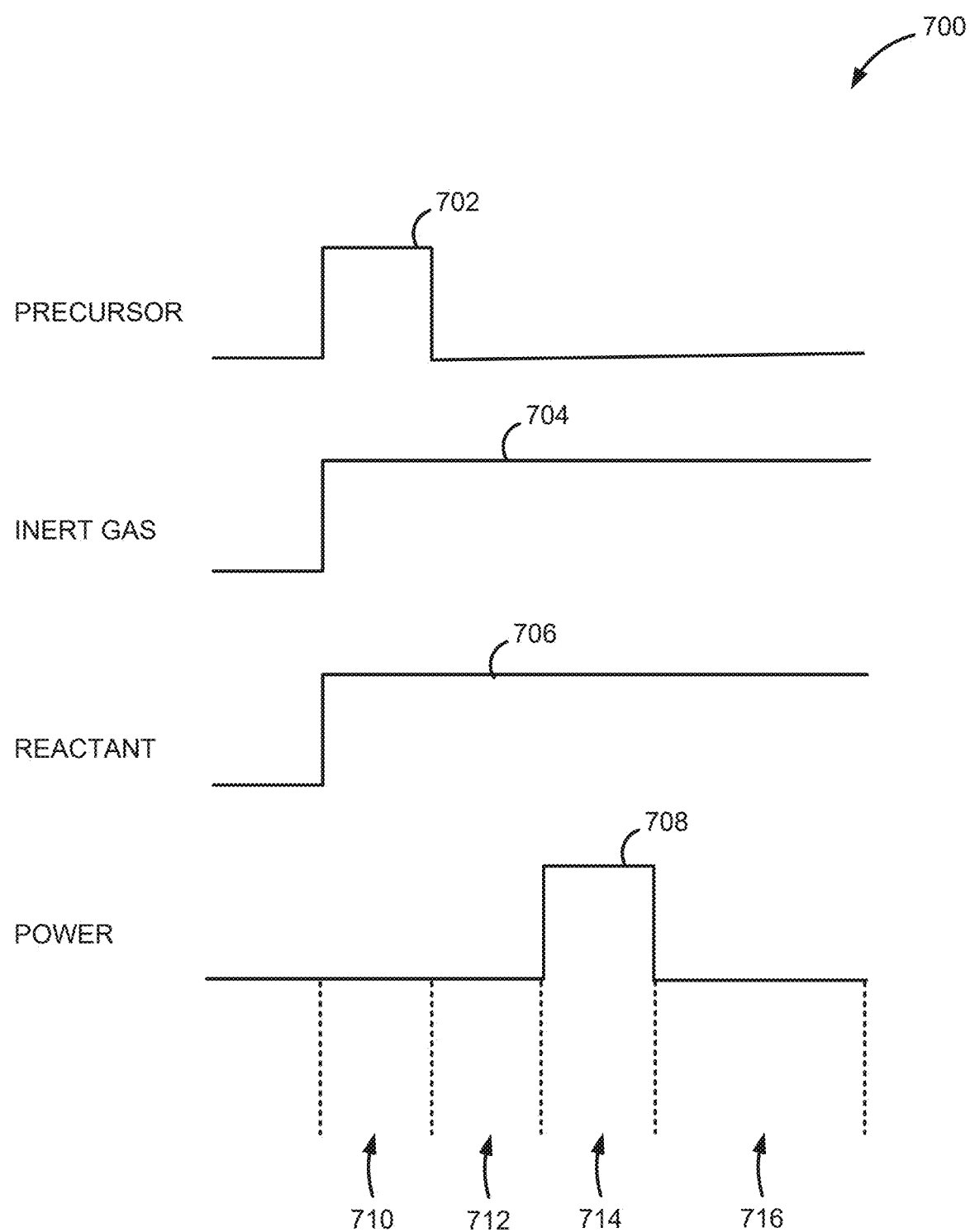
FIG. 7 illustrates a timing sequence in accordance with at least one embodiment of the disclosure.

FIG. 7 illustrates a timing sequence 700 suitable for exemplary plasma-enhanced cyclical deposition process. Timing sequence 700 includes a precursor pulse period 702, an inert gas pulse period 704, a reactant pulse period 706, and a plasma pulse period 708. As noted above, the inert gas pulse period 704 may be optional in some cases. Further, in some cases, a sequence may not include reactant pulse period 706. In some cases, reactant pulse period 706 can include providing a reactant and an inert gas. Steps or pulse periods of timing sequence 700 can be repeated a number of times to obtain a transformable layer of desired thickness. In some cases, inert gas pulse 704 and/or reactant pulse 706 may start before precursor pulse 702. Steps or pulse periods can be performed continuously within a reaction chamber of a reactor system until a desired thickness of transformable layer is obtained.

As used herein, pulse period means a period in which a gas (e.g., precursor, reactant, inert gas, and/or carrier gas) is flowed to a reaction chamber and/or a period in which power is applied (e.g., power to produce a plasma). A height and/or width of the illustrated pulse period is not necessarily indicative of a particular amount or duration of a pulse.

Table 1 below illustrates exemplary process conditions for steps/pulse period of an exemplary plasma-enhanced cyclical deposition process.

TABLE 1

Conditions for Steps/Pulse Periods 702-708

| | |
|---|---|
| Reaction Chamber Pressure | Between 2 torr and 20 torr or 2 torr and 10 torr or 2 torr and 5 torr |
| Susceptor temperature | Between 50° C. and 550° C. or 50° C. and 300° C. or 50° C. and 150° C. |
| Flowrate of carrier gas for precursor | Between 500 sccm and 4000 sccm or 1000 sccm and 1500 sccm |
| Flowrate of reactant | Between 100 sccm and 5000 sccm or 500 sccm and 2000 sccm |
| Flowrate of inert gas | Between 2000 sccm and 12000 sccm or 6000 sccm and 8000 sccm |
| Flowrate of sealing gas | Between 100 sccm and 500 sccm or 200 sccm and 300 sccm |
| Direct plasma power | Between 100 W and 2000 W or 200 W and 1000 W or 300 W and 500 W |
| Distance between electrodes | Between 2 mm and 15 mm or 3.5 mm and 8 mm |
| Duration of precursor pulse | Between 0.1 sec and 5 sec or 0.3 sec and 1 sec |
| Duration of plasma period | Between 0.1 sec and 5 sec or 0.3 sec and 1 sec |

As illustrated in FIG. 7, timing sequence 700 can be segmented into a feed segment 710, a purge segment 712, a plasma segment 714, and a second purge segment 716. During feed segment 710, a reactant, optionally an inert gas, and a precursor can be provided to the reaction chamber—e.g., the flow of the precursor, inert gas, and reactant within the reaction chamber can overlap. In other words, the precursor pulse period 702, the reactant pulse period 706, and the inert gas pulse period 704 can overlap. In some cases, at least two pulse periods 702-706 overlap. In accordance with further examples, the precursor pulse period and the plasma pulse period do not overlap.

Figure 3:
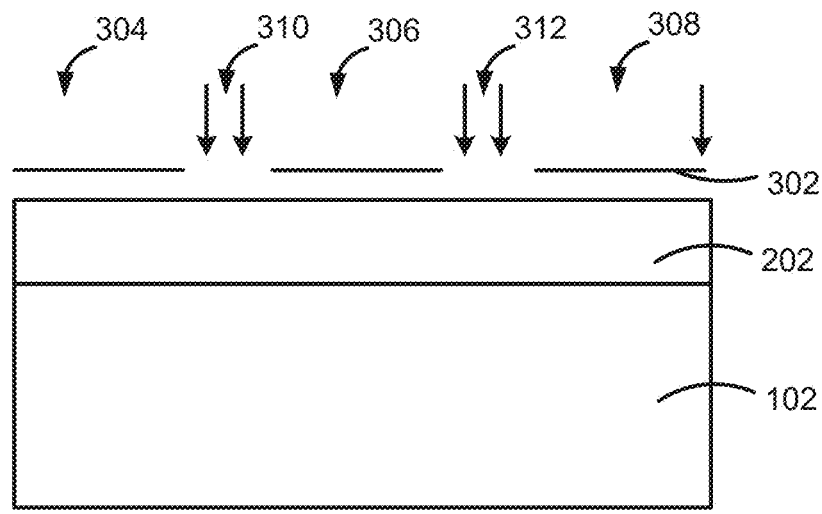
Figure 4:
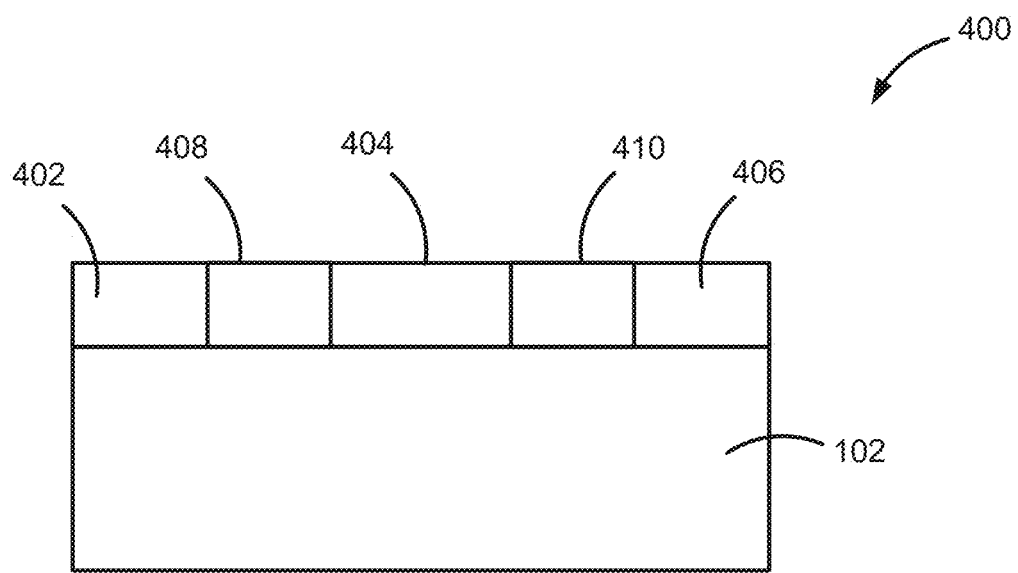

Once transformable layer 202 is formed on substrate 102, transformable layer 202 can be exposed to energy to form a second material in a first region of the transformable layer exposed to the energy and a second region of the transformable layer not exposed to the energy comprising the first material. With reference to FIG. 3, a mask 302 can be used to block energy (e.g., ultraviolet light) in regions 304, 306, and 308, while allowing the energy (e.g., UV light) through to transformable layer 202 in regions 310 and 312, thereby forming second material 408, 410 with first material 402, 404, and 406.

By way of examples, ultraviolet light having a wavelength of about 193 nm to about 280 nm can be used to transform transformable layer first material to second material in regions 310 and 312. A duration of the step of exposing can be about 10 to about 3600 or about 300 to about 600 seconds.

As noted above, first material can include silicon oxygen carbon nitride, silicon oxygen carbide, metal oxygen carbide, and/or metal oxygen carbon nitride. In the case in which the first material comprises silicon oxygen carbon nitride, the first material can act as a positive transformable layer and be transformed to silicon oxide. In the case in which the first material comprises silicon oxygen carbide, the first material can act as a negative transformable layer and be transformed to silicon oxide. In the case in which the first material comprises metal oxygen carbon nitride, the first material can act as a positive transformable layer and can be transformed to metal oxide. In the case in which the first material comprises metal carbide, the first material can act as a negative transformable layer and can be transformed to metal oxide.

Once second material 408, 410 is formed, a selective etch process can be used to selectively remove first material 402, 404, 406 relative to second material 408, 410 or to selectively remove second material 408, 410 relative to first material 402, 404, 406. The selective removal can be done using a wet or dry etch process. By way of examples, a step of selectively etching the first material relative to the second material can include using wet etch with fluorine included etchants (e.g., hydrogen fluoride). A step of selectively etching the second material relative to the first material can including using wet etch with fluorine included etchants (e.g., hydrogen fluoride). In this context, selective removal or etch means that one material exhibits an etch or removal rate of one material (e.g., first or second) greater than 20 times, greater than 10 times, or greater than 5 times the etch or removal rate of the other (first or second) material.

FIG. 5 illustrates an example of a structure 500 in which first material 402, 404, and 406 is selectively removed, such that second material 408, 410 (e.g., a silicon or metal oxide) remains on the surface of substrate 102. FIG. 6 illustrates an example of a structure 600 in which second material 408, 410 is selectively removed, such that first material 402, 404, and 406 (e.g., silicon or metal oxide) remains on the surface of substrate 102.

FIGS. 8-11 illustrate a technique of forming a thinning a pattern (e.g., a spacer pattern) using a transformable layer in which an etch rate (e.g., a wet etch rate) changes as a function of time of exposure to energy.

Figure 8:
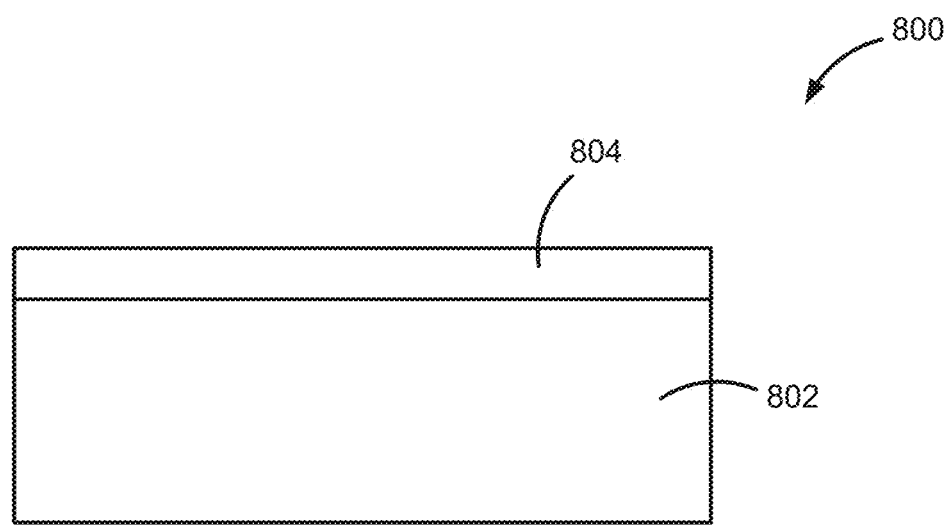
FIGS. 8-11 illustrate additional structures in accordance with at least one embodiment of the disclosure.
Figure 9:
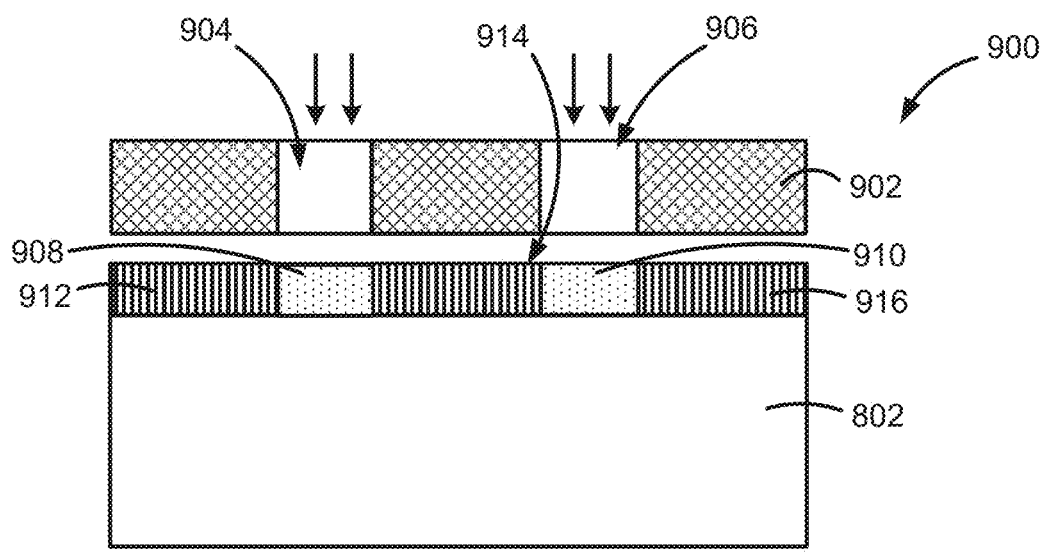
Figure 10:
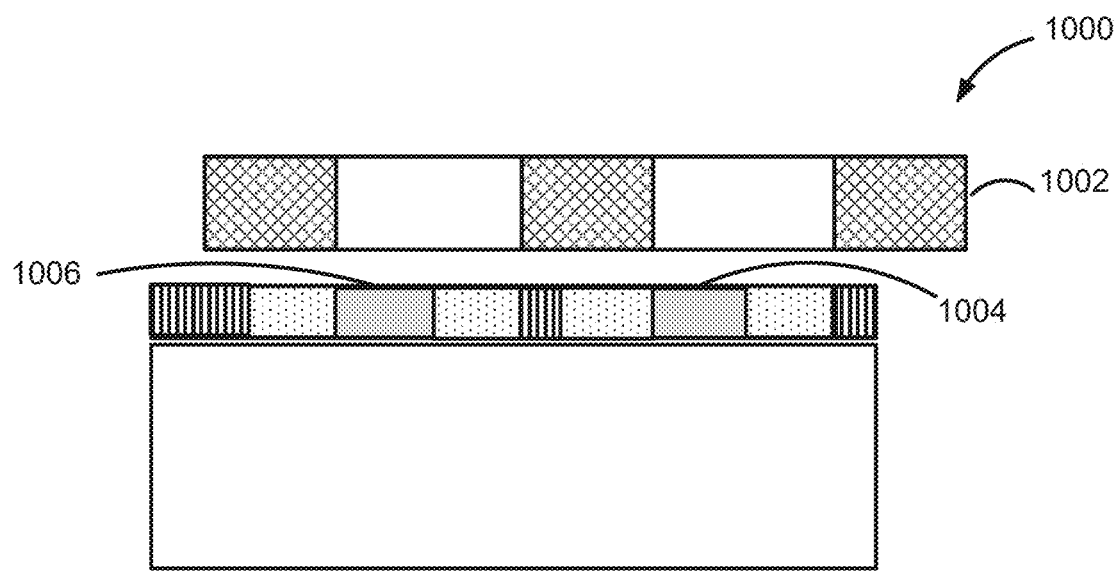

As illustrated in FIG. 8, a transformable layer 804 can be formed overlying a substrate 802. Substrate 802 and transformable layer 804 can be the same or similar to substrate 102 and transformable layer 202. Similarly, transformable layer 804 can be formed using the same or similar process used to form transformable layer 202.

Figure 11:
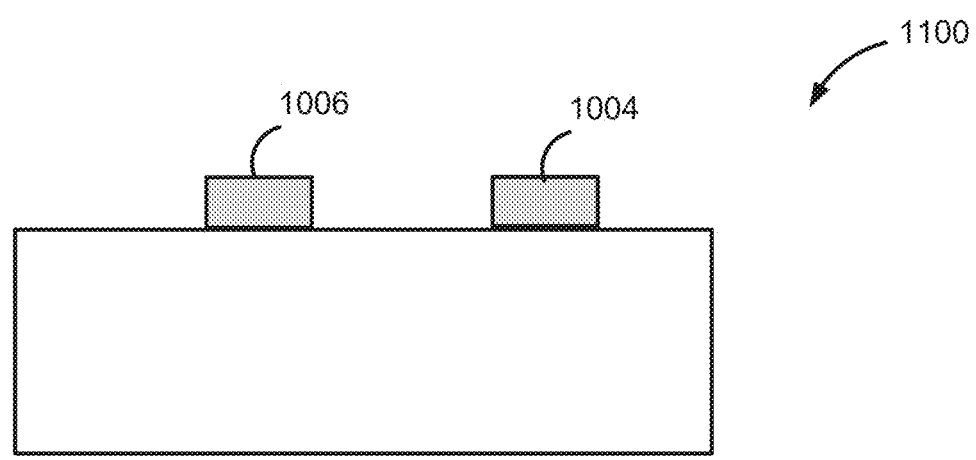

Energy can then be applied to regions of transformable layer 804 through a mask 902 in regions 904, 906 to form second material 908, 910, with first material 912, 914, 916. Then, another mask 1002 can be used to form a third material 1004, 1006, which may be selectively etched relative to first material 912, 914, 916 and second material 908, 910 or, as illustrated in FIG. 11, first material 912, 914, 916 and second material 908, 910 can be selectively etched relative to third material 1004, 1006.

In accordance with further examples of the disclosure, structures and methods as described herein can be used to form a device, such as a semiconductor or other electronic device. The first material or the second material can form a portion of the structures and devices. For example, the first material or the second material or the third material (whichever is not selectively etched) can form part of the device.

Figure 12:
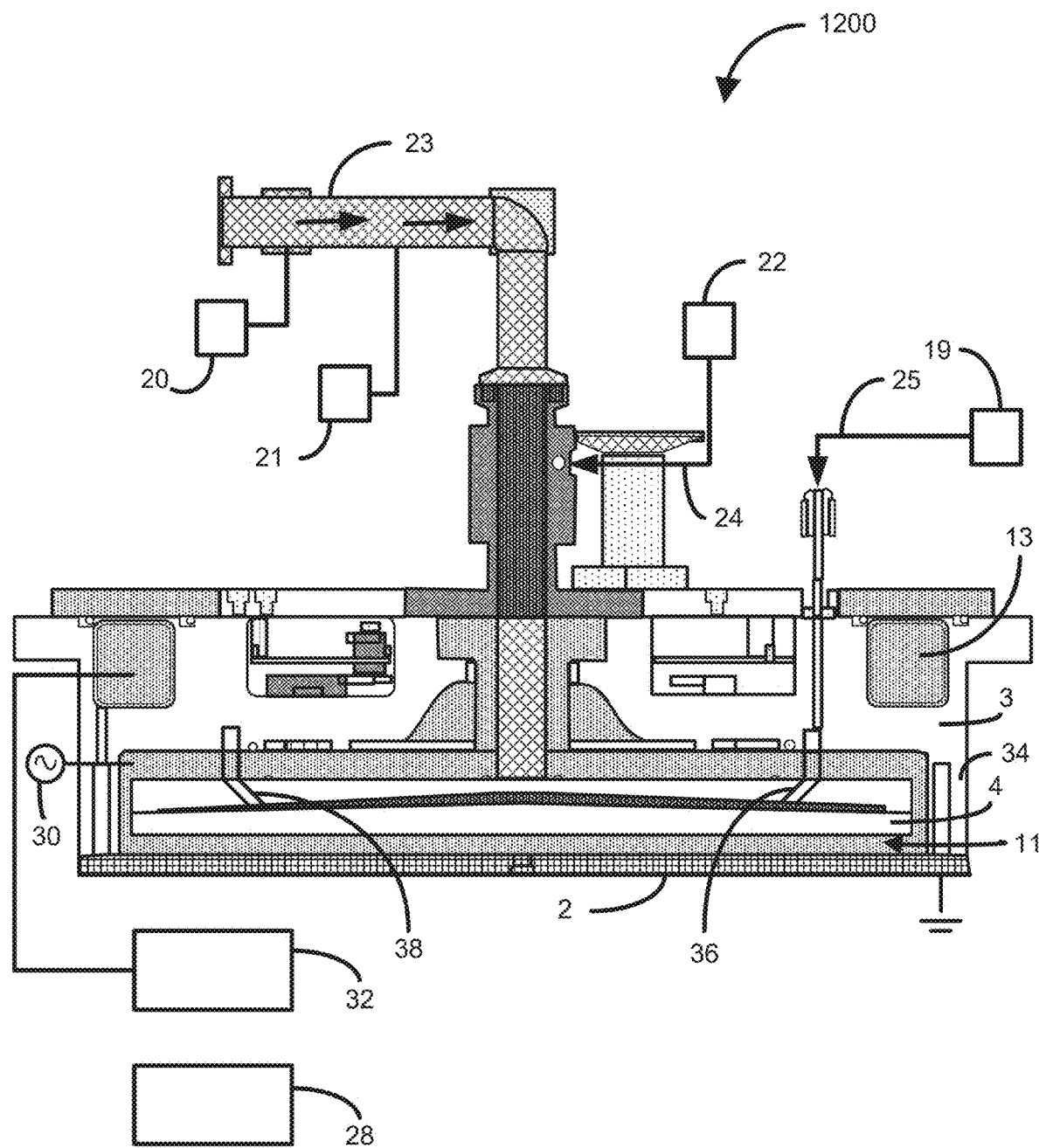
FIG. 12 illustrates a system in accordance with at least one embodiment of the disclosure.

Turning now to FIG. 12, a reactor system 1200 is illustrated in accordance with exemplary embodiments of the disclosure. Reactor system 1200 can be used to perform one or more steps or substeps as described herein and/or to form one or more structures or portions thereof as described herein.

Reactor system 1200 includes a pair of electrically conductive flat-plate electrodes 4, 2 in parallel and facing each other in the interior 11 (reaction zone) of a reaction chamber 3. Although illustrated with one reaction chamber, system 1200 can include two or more reaction chambers. A plasma can be excited within reaction chamber 3 by applying, for example, HRF power (e.g., 100 kHz, 13.56 MHZ, 27 MHz, 60 MHz, 2.45 GHZ, or any values therebetween) from plasma power source 30 to one electrode (e.g., electrode 4) and electrically grounding the other electrode (e.g., electrode 2). A temperature regulator can be provided in a lower stage 2 (the lower electrode), and a temperature of a substrate (not illustrated) placed thereon can be kept at a desired temperature, such as the substrate temperatures noted above. Electrode 4 can serve as a gas distribution device, such as a shower plate or showerhead. Precursor gases, reactant gases, and a carrier or inert gas, if any, or the like can be introduced into reaction chamber 3 using one or more of a gas line 23, a gas line 24, and a gas line 25, from sources 19, 21, 22, and 20, respectively, and through the shower plate 4. Although illustrated with three gas lines 23, 24, and 25, reactor system 1200 can include any suitable number of gas lines. By way of examples, source 20 can correspond to a purge gas source, source 21 can correspond to a reactant source and/or inert source, source 22 can correspond to a precursor source (e.g., with a carrier source), and source 19 can correspond to an edge gas source (e.g., nitrogen and argon) provided near an edge interior 11 through conduits 36, 38. Reaction chamber 3 can be referred to as a closed type chamber, because, in the illustrated example, a chamber wall 34 is contacted with susceptor/plate 2.

In reaction chamber 3, a circular duct 13 with an exhaust line 7 can be provided, through which gas in the interior 11 of the reaction chamber 3 can be exhausted. In some embodiments, continuous flow of a carrier gas to reaction chamber 3 can be accomplished using a flow-pass system (FPS).

Reactor system 1200 can include one or more controller(s) 28 programmed or otherwise configured to cause one or more method steps as described herein to be conducted. Controller(s) 28 are coupled with the various power sources, heating systems, pumps, robotics and gas flow controllers, or valves of the reactor, as will be appreciated by the skilled artisan. By way of example, controller 28 can be configured to control gas flow of a precursor, a reactant, and an inert gas into at least one of the one or more reaction chambers to form a transformable layer on a surface of a substrate. As noted above, the gas flow of the precursor and the gas flow of the reactant can overlap within the at least one of the one or more reaction chambers. The controller can be similarly configured to perform additional steps as described herein.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

What is claimed is:

1. A method of forming patterned features on a surface of a substrate, the method comprising the steps of:
    using a plasma-enhanced cyclical deposition process, forming a transformable layer comprising a first material on the surface of the substrate, the first material comprising one or more of silicon oxygen carbon nitride (comprising silicon, oxygen, carbon, and nitrogen), silicon oxygen carbide (comprising silicon, oxygen, and carbon), metal carbide (comprising a metal and carbon), or metal carbon nitride (comprising metal, carbon, and nitrogen);
    exposing the transformable layer to energy to form a second material in a first region of the transformable layer exposed to the energy and a second region of the transformable layer not exposed to the energy comprising the first material; and
    wherein the plasma-enhanced cyclical deposition process is performed within a reaction chamber and comprises continually providing a reactant during one or more deposition cycles to the reaction chamber,
    wherein the reactant comprises a nitrogen-containing compound, and
    wherein an etch rate of the first material is different than an etch rate of the second material.

2. The method according to claim 1, further comprising a step of selectively etching the first material relative to the second material.

3. The method according to claim 2, further comprising forming a third material in a third region of the transformable layer, wherein an etch rate of the third material is greater than the etch rate of the second material.

4. The method according to claim 1, further comprising a step of selectively etching the second material relative to the first material.

5. The method according to claim 4, wherein an etch rate of the second material is greater than 20 times, greater than 10 times, or greater than 5 times the etch rate of the first material.

6. The method according to claim 1, further comprising forming a third material in a third region of the transformable layer, wherein an etch rate of the first material and an etch rate of the second material are greater than an etch rate of the third material.

7. The method according to claim 1, wherein the plasma-enhanced cyclical deposition process comprises:
    providing a precursor to the reaction chamber for a precursor pulse period; and
    after the steps of providing the precursor for the precursor pulse period and providing the reactant, forming a plasma within the reaction chamber using the reactant for a plasma pulse period.

8. The method according to claim 1, wherein the plasma-enhanced cyclical deposition process comprises:
    providing a precursor to the reaction chamber for a precursor pulse period;
    providing an inert gas to the reaction chamber; and
    after the steps of providing the precursor for the precursor pulse period and providing the inert gas, forming a plasma within the reaction chamber using the inert gas for a plasma pulse period.

9. The method according to claim 7, wherein the precursor comprises one or more of an aminosilane and a metal organic compound.

10. The method according to claim 7, wherein the precursor comprises one or more of silicon, titanium, tin, hafnium, zirconium, indium, antimony, tellurium, iodine, and cesium.

11. The method according to claim 7, wherein the precursor comprises one or more of diisopropylaminosilane, tetrakis (dimethylamino) titanium, and titanium isopropoxide.

12. The method according to claim 11, wherein the precursor comprises titanium isopropoxide.

13. The method according to claim 1, wherein the reactant comprises nitrogen and argon.

14. The method according to claim 8, wherein the inert gas comprises argon.

15. The method according to claim 7, further comprising a step of providing an inert gas to the reaction chamber for an inert gas pulse period.

16. The method according to claim 1, wherein the first material comprises the silicon oxygen carbon nitride, metal carbide, and/or metal carbon nitride.

17. A structure comprising:
a substrate; and
a layer comprising the first material and the second material formed according to claim 1.

18. The structure of claim 17, further comprising a third material formed by exposing the second material to energy.

19. A system comprising:
one or more reaction chambers;
a precursor source comprising one or more of a silicon precursor, a titanium precursor, a tin precursor, a hafnium precursor, a zirconium precursor, an indium precursor, an antimony precursor, a tellurium precursor, an iodine precursor, and a cesium precursor;
a reactant source;
a plasma power source;
a gas distribution device coupled to the plasma power source;
a first gas line coupled to a top central portion of the gas distribution device;
a second gas line coupled to the gas distribution device proximate an edge of the gas distribution device;
an exhaust source; and
a controller,
wherein the controller is configured to control gas flow of a precursor and a reactant into at least one of the one or more reaction chambers to perform the method of claim 1.

20. The method according to claim 1, wherein the first material comprises the metal carbide.

* * * * *